US010485141B2

United States Patent
Rogers et al.

(10) Patent No.: US 10,485,141 B2
(45) Date of Patent: Nov. 19, 2019

(54) DATA CENTRE COOLING SYSTEM

(71) Applicant: Bripco BVBA, Antwerp (BE)

(72) Inventors: Paul Rogers, Stanley Pontlarge (GB); Neil Crow, Cheltenham (GB); Lucian Hicks, Cheltenham (GB)

(73) Assignee: BRIPCO BVBA, Antwerp (BE)

( * ) Notice: Subject to any disclaimer, the term of this patent is extended or adjusted under 35 U.S.C. 154(b) by 0 days.

(21) Appl. No.: 15/574,782

(22) PCT Filed: May 27, 2016

(86) PCT No.: PCT/EP2016/062018
§ 371 (c)(1),
(2) Date: Nov. 16, 2017

(87) PCT Pub. No.: WO2016/193152
PCT Pub. Date: Dec. 8, 2016

(65) Prior Publication Data
US 2018/0124955 A1    May 3, 2018

(30) Foreign Application Priority Data
Jun. 3, 2015   (GB) .................................. 1509585.4

(51) Int. Cl.
*H05K 7/20*    (2006.01)
*H05K 7/14*    (2006.01)

(52) U.S. Cl.
CPC ....... *H05K 7/20745* (2013.01); *H05K 7/1497* (2013.01); *H05K 7/20727* (2013.01); *H05K 7/20736* (2013.01)

(58) Field of Classification Search
CPC ............ H05K 7/20727; H05K 7/1497; H05K 7/20745; H05K 7/20736; H05K 7/20; H05K 7/14
(Continued)

(56) References Cited

U.S. PATENT DOCUMENTS 4,603,810 A * 8/1986 Schleimer ................ C21C 5/32
239/1
7,430,118 B1 * 9/2008 Noteboom ......... H05K 7/20745
361/695
(Continued)

FOREIGN PATENT DOCUMENTS

CN    1017909299 A    7/2010
WO    2008150566 A1    12/2008
(Continued)

OTHER PUBLICATIONS

How to seize and design Ducts (Year: 2012).*
(Continued)

*Primary Examiner* — Mandeep S Buttar
(74) *Attorney, Agent, or Firm* — Carlos A. Fisher; Stout, Uxa & Buyan, LLP

(57) ABSTRACT

A method of cooling a data centre, and a data centre, is disclosed. Optionally, the data centre comprises: a cooling air source (201); at least one rack room (202) having a floor and rack storage areas (203a-203d) on the floor, each rack storage area accommodating racks in which items of electronic equipment having at least one fan (204) are housed; one or more cold aisles (205) in the rack room, each cold aisle being adjacent to a rack storage area; one or more hot aisles (206) in the rack room, each hot aisle being adjacent to a rack storage area; and an air supply corridor (207) for transporting cooling air, above the floor, from the cooling air source to the one or more cold aisles. The method optionally comprises transporting cooling air from the cooling air source (201) to the one or more cold aisles (205) substantially under the control of the fans (204) of the items of electronic equipment.

37 Claims, 14 Drawing Sheets

(58) Field of Classification Search
USPC ......... 361/695, 679.46, 679.47, 679.49, 678, 361/694, 696; 454/184, 233; 165/104.34, 80.2, 104.33, 59; 62/259.2, 62/440
See application file for complete search history.

(56) References Cited

U.S. PATENT DOCUMENTS

| | | | |
|---|---|---|---|
| 8,174,829 B1* | 5/2012 | Rotheroe | H05K 7/20745 165/80.4 |
| 2007/0135032 A1* | 6/2007 | Wang | F24F 9/00 454/184 |
| 2009/0326721 A1* | 12/2009 | Sugiyama | F24F 11/0001 700/282 |
| 2010/0188810 A1 | 7/2010 | Andersen et al. | |
| 2010/0248609 A1 | 9/2010 | Tresh et al. | |
| 2010/0267325 A1* | 10/2010 | Matser | H05K 7/20745 454/184 |
| 2011/0083824 A1* | 4/2011 | Rogers | H05K 7/20745 165/80.2 |
| 2012/0167610 A1* | 7/2012 | Dunnavant | F28C 1/14 62/314 |
| 2013/0176675 A1* | 7/2013 | Hundertmark | F24F 12/006 361/679.31 |
| 2013/0267161 A1 | 10/2013 | Iqbal | |
| 2014/0254089 A1 | 9/2014 | Eichelberg et al. | |

FOREIGN PATENT DOCUMENTS

| | | |
|---|---|---|
| WO | 2011006027 A2 | 1/2011 |
| WO | 2011148175 A2 | 12/2011 |
| WO | 2013039645 A2 | 3/2013 |

OTHER PUBLICATIONS

Sverdlik, Yevgeniy, www.datacenterdynamics.com—Datacenter Dynamics—The Business of Data Centers. "DCD San Francisco: YTC—Yahoo!'s answer to humid places", Jul. 17, 2012.
GB Intellectual Property Office Search Report, search date Feb. 24, 2016.
Robison, A.D., Recovery Act: Yahoo! Compute Coop (YCC): A Next-Generation Passive Cooling Design for Data Centers, Jul. 20, 2011.
Kassner, Michael P.www.datacenterdynamics.com—DatacenterDynamics—The Business of Data Centers. Yahoo's Compute Coop is not for chickens, Mar. 6, 2015.

* cited by examiner

DATA CENTRE COOLING SYSTEM

FIELD OF THE INVENTION

The present invention concerns data centres and a method of cooling equipment in a data centre. The invention also concerns apparatus for cooling a data centre.

BACKGROUND OF THE INVENTION

A data centre is a late 20th Century development that has grown as a response to the increasing demand for computer processing capability and a recognition of the importance of information technology (IT) in the place of every business and organisation today. Whereas smaller organisations have sufficient processing power with laptops, PCs and occasionally servers, larger organisations require higher capacity centralised processing to serve a wide range of needs and applications. A few years ago this capacity was supplied by large mainframe computers, but more recently the method used has been to provide data centres comprising many networked computer servers known as "blades" installed in racks enabling controlled and modular expansion of capacity. The racks also typically house storage systems and/or telecommunications equipment such as routers to handle data flow between the computer servers and data flow between the data centre and the outside world.

One key problem faced is how to cool a data centre effectively and efficiently. It will be appreciated that data centre facilities are of critical importance to their users, and so overheating of servers (which is likely to cause the server to temporarily or even permanently fail) must be avoided.

One method of the prior art, now recognised to be inefficient, is to provide a room in which air-conditioning units (mechanical DX coolers) flood the room with chilled air (by drawing air from the room, chilling it, and then pumping the chilled air so produced back into the room) so as to provide a reservoir of chilled air from which the servers may draw cooling air by means of their internal fans. No entrainment of cooling air is provided.

In another data centre arrangement of the prior art, the racks are laid out in rows. Cooling is provided by direct expansion (DX) or chilled water cooling plants. The cool air produced by these units is entrained through an underfloor plenum and exits through floor grilles at the front of the IT rack rows. The IT products installed in the racks contain integral fans which draw the cooled air from the front across the circuitry and heat is exhausted via vents in the products to the rear.

A typical version of the prior art arrangement utilising under-floor cooling and racks in rows, is shown schematically in FIG. 1 of the attached drawings. Thus, the data centre includes a rack room 1 defined by walls 2 in which two sets of racks 4 for IT equipment are accommodated. The IT equipment in the racks 4 generate heat, represented by arrows 6. The cooling of the IT equipment is achieved by introducing cold air, via a floor void, into the room by means of air conditioning units, the cold air being represented by arrows 8.

The drive for more efficient use of power has given rise to a need to make the cooling regimes used in data centres more efficient, as cooling of equipment typically contributes significantly to the power used by a data centre. For example, the power usage in certain data centres may require between 1 kW and 2 kW of power for every 1 kW of power used to power the IT equipment, a significant proportion of which would be related to cooling.

In certain arrangements of the prior art, the separation between IT racks creates a 'hot aisle' into which air is expelled by the IT products in the racks and a 'cold aisle' from which cooler air is drawn into and through the IT products by their integral fans. In such arrangements, it is important to maintain a controlled air flow so that no 'hot spots' are created within the rack room where overheating servers are not in fluid communication with cooling air. One method of avoiding this problem is to supply significantly more cold air than the servers actually need at any given time and ensuring that the required amount of cooling air is provided to every server in the rack room.

Typically, cooling air is transported from the cooling plant to the racks via duct work and/or an underfloor plenum, both of which add significant resistance to air flow. In order to supply the large volumes of cooling air required to ensure that each and every server is supplied with an adequate amount of cooling air, the cooling air has to travel at high velocity through the duct work and/or the underfloor plenum. Typically, large, powerful fans are used to drive the cooling air from the cooling plant to the servers. When air is supplied to a cold aisle via duct work and/or an underfloor plenum at high velocity, it can be difficult to ensure that each and every server in the cold aisle is effectively cooled. For example, servers located close to the point at which high velocity cooling air enters the cold aisle are often bypassed by the cooling air stream because the integral server fans are not powerful enough to redirect the cooling air and draw the air across the server effectively. One approach to reducing the velocity of the cooling air (whilst maintaining adequate cooling) is to lower the temperature of the cooling air by increasing the amount of mechanical cooling. However, reducing the temperature of the cooling air is an energy intensive process that reduces the efficiency of the data centre.

One approach to improving the efficiency of data centre cooling is to utilise ambient outside air in addition to or instead of mechanically cooled air. Often, in data centre cooling methods utilising cooling air comprising ambient air, the temperature of the cooling air is higher than in cooling methods utilising cooling air consisting of mechanically cooled air. Typically, to achieve adequate cooling using higher temperature cooling air, the airflow across the servers needs to be higher, and so even larger volumes of cooling air need to be supplied to the cold aisles. WO2010/139919, WO2011/073668, WO2011/148175 and WO2010/139921 disclose methods of utilising ambient air from outside a data centre to cool items of electronic equipment in which cooling air is transported to the cold aisles via an access corridor, thus providing a relatively low resistance path via which large volumes of cooling air can be transported to the cold aisles at low velocity. To ensure that the servers are provided with an adequate amount of cooling air, those methods utilise large fans upstream of the servers to maintain a positive pressure of cooling air in the cold aisles relative to the pressure of the hot air in the hot aisles.

In general, known methods of cooling data centre buildings having a controlled air supply path with hot and cold aisle separation, the methods comprising the use of ambient air (optionally with filtration of the air), mechanically cooled air (for example using direct expansion or chilled water cooling plants), and/or humidification/dehumidification of cooling air, utilise banks of fans, individual large fans, and/or cooling equipment comprising large integral fans.

Although considered necessary to ensure adequate and reliable cooling, the operation of large central fan arrangements accounts for a significant proportion of a data centre's energy usage. Furthermore, such central fan arrangements can become a single point of failure for the data centre. For example, should a fault develop with a central fan arrangement, the entire data centre might be forced offline. Additionally, during operation, large fan banks produce undesirable levels of noise. Often, sound attenuation equipment is used to reduce the volume of the fan noise transmitted to other parts of the data centre, for example personnel corridors and server rooms, and its surroundings. Such sound attenuation equipment adds to the construction and maintenance cost of the data centre, and adds resistance to the air flow path in turn necessitating the use of stronger fans and leading to an increase in operational costs.

A small number of methods use convection to draw cooling air through a data centre building as an alternative to using central banks of fans. In such methods, hot air rises through high level chimneys and or roof ridge vents, with assistance from the prevailing wind to draw air out of the top of the building and to push ambient air into a lower part of the building through external wall vents. A drawback of such designs is that they require careful planning and siting since their utility is dependent on finding an appropriate location. The limited number of suitable locations and the requirement to design each new data centre individually significantly reduces the flexibility of such methods.

The present invention seeks to provide an improved method and apparatus for cooling a data centre. Alternatively or additionally, the present invention seeks to provide a system for cooling a data centre that mitigates one or more of the above mentioned disadvantages.

SUMMARY OF THE INVENTION

The present invention provides, according to a first aspect, a method of cooling a data centre having one or more racks of items of electronic equipment (for example operational IT equipment such as rack-mounted servers, rack-mounted network equipment or the like) each having its own cooling fan, and preferably one or more associated cold aisles, in which method cooling air is transported, substantially under the control of the fans of the electronic equipment, from a cooling air source to the one or more racks of items of electronic equipment, preferably via one or more cold aisles. The data centre preferably comprises the cooling air source. There may be at least one rack room having a floor and a plurality of rack storage areas on the floor, each rack storage area accommodating a plurality of the racks in which a plurality of rack-mountable items of electronic equipment, each having at least one fan, are housed. Each cold aisle is typically adjacent to a rack storage area. There may be one or more hot aisles in the rack room. Each hot aisle will typically be adjacent to a rack storage area. There may be an air supply corridor for transporting cooling air, above the floor, from the cooling air source to the one or more cold aisles.

It will be appreciated that, because cooling air is transported from the cooling air source to the one or more cold aisles substantially under the control of the fans of the rack-mountable items of electronic equipment, either the cooling air source has no fans (or is not directly associated with any fans), or the cooling air source has one or more fans that play no significant part in supplying cooling air to the items of electronic equipment.

It may be that the method allows a data centre to be 'scaled up' more easily, for example because adding additional items of IT equipment each having one or more integral fans to a data centre cooled according to the method also adds air moving capability to the data centre. In known methods that, for example, use large, fixed banks of fans in a cooling air source to control the transport of cooling air from the cooling air source to the items of electronic equipment, the capacity of the method to move cooling air, and thus the number of items of electronic equipment that can be cooled, is fixed at the time of construction of the data centre. It will be appreciated that such known methods of cooling items of electronic equipment may limit subsequent expansion of the data centre. Thus, it may be that the present method provides a more flexible method of cooling items of electronic equipment.

It will be appreciated that the rack storage areas may comprise server racks, also known as 'blade' racks, server cabinets and 'blade cabinets. It may be that the rack storage areas are arranged in rows, for example a row of server racks or cabinets arranged in a continuous line.

A data centre building comprising segregated hot and cold aisles and an air supply corridor for transporting cooling air from the cooling air source to the one or more cold aisles provides a low resistance, high volume air flow path through the data centre and prevents unwanted mixing of cold and hot air. Embodiments of the method of the first aspect of the invention may utilise a data centre building having an architecture and internal layout creating very low/minimal air resistance with substantially (or entirely) all entrainment of air through large open areas. It will be appreciated that it is desirable in operating the method of the present invention to make efficient use of/optimise the layout and internal dimensions of the data centre in order to minimise the resistance to air flow around the building (or at least to create an air flow path having a resistance that is sufficiently low to facilitate practical operation of the method of the invention). Such a low resistance, high volume air path environment reduces the requirement for mechanical air circulation, thereby allowing the fans of the items of electronic equipment to move air around the data centre through their own fan power. A large cold space (comprising the one or more cold aisles and the air supply corridor) may provide a reservoir of large volumes of treated cooling air having the temperature and humidity required to effect efficient cooling. It will be understood that "treated air" is air having a temperature and a humidity falling within pre-determined upper and lower temperature and humidity limits. It may be that a large reservoir of readily available cooling air is useful in modes of operation of the data centre in which cooling requirements fluctuate rapidly due to increases and decreases in load on the items of electronic equipment.

There may be a well-defined airflow path along which air flows within the data centre to and from a given item of electronic equipment in a rack. Such a path may for example be deemed to start at the cooling air source, then follow the air supply corridor above the floor, then enter the cold aisle associated with the rack in which the given item of electronic equipment is accommodated, then pass from one side of the rack to the other, for example via the space occupied by the given item of electronic equipment and thus through the fan of the item of electronic equipment, and then into a hot-air extraction path, for example along a hot aisle and possibly subsequently a hot air corridor or air extraction corridor. The flow paths of air for cooling the items of electronic equipment in the racks may be such that they allow for the air flows to cooperate and combine together. It may be that the building and infrastructure (ducts, corridors, aisles for example) that provide the space within which the air may flow dictates the direction of the air flow path(s). Thus, air flows in the data centre may be entrained so that air flowing to a given item of electronic equipment is encouraged to flow along a predetermined path. It may for example be that the structure above and below, and to either side of an air-flow path, guides the air along its flow path with the assistance of the flow caused by the fans in the electronic equipment. This may, for example, be viewed in contrast with the case in which servers are provided in an open room flooded with air-conditioned air in which there is no entrainment of air.

Preferably, the cooling air flow path leading from the cooling air source to the rack-mountable items of electronic equipment has a sum volume that is at least 75%, for example at least 90%, of the volume of the warm air flow path leading from the rack-mountable items of electronic equipment back to the cooling air source. Optionally, the cooling air flow path leading from the cooling air source to the rack-mountable items of electronic equipment has a sum volume that is from 75% to 125%, for example from 90% to 110%, of the volume of the warm air flow path leading from the rack-mountable items of electronic equipment back to the cooling air source. It will be appreciated that when the data centre comprises an air supply corridor and one or more cold aisles, the sum volume of the cooling air flow path comprises the total air volume of the air supply corridor and the total air volume of the one or more cold aisles. For example, if the data centre comprises a cooling air source that supplies air directly into an air supply corridor having a cross-sectional area of 6 $m^2$ and a length of 20 m, and five cold aisles having a cross-sectional area of 5 $m^2$ and lengths of 10 m, the cold aisles being directly connected to the air supply corridor, the sum volume of the cooling air flow path would be 370 $m^3$. If that data centre comprises five hot aisles directly connected to an air exhaust corridor for returning warm air directly back to the cooling air source, the sum volume of the hot aisles and the air exhaust corridor is optionally from 278 to 463 $m^3$, preferably 333 to 407 $m^3$. It may be that when the sum volume of the cooling air supply path is similar to or larger than the sum volume of the warm air return path, an imbalance in resistance to air flow that might otherwise exist is reduced in the data centre. It may be that having a sum volume of the cooling air supply path that is similar to the sum volume of the warm air return path is particularly useful when the cooling air source is an indirect air handling unit. It may for example be that the difference in the sum volume of the cooling air supply path and the sum volume of the warm air return path is less than 50% of the larger volume, preferably less than 20% difference.

It may be that the data centre does not include a sound attenuation device along the air flow path from the cooling air source to the racks of items of electronic equipment. The absence of a sound attenuation device along the airflow path may further reduce resistance to air flow, thus improving the efficiency of the method.

It may be that the air flow path from the cooling air source to racks of the items of electronic equipment does not include duct work (ducting having a cross-sectional area of 2 $m^2$ or less) or an underfloor plenum. Optionally, the air flow path from the cooling air source to the racks of items of electronic equipment does not include an over-ceiling plenum. Preferably, the air flow path from the cooling air source to the racks of items of electronic equipment consists of the air supply corridor and the cold aisle.

When the transport of cooling air from the cooling air source to the one or more cold aisles is substantially under the control of the fans of the rack-mountable items of electronic equipment, the efficiency of the method of cooling the data centre building is improved because there is little or no duplication in operation of equipment to transport the cooling air from the cooling air source to the racks of items of electronic equipment. Furthermore, the failure of one or more fans on a particular item of electronic equipment does not reduce the cooling of other items of electronic equipment which each comprise their own fan or fans. Thus, it may be that the method of the first aspect of the invention allows for the temperature and/or humidity of the cooling air to be maintained through a control system (the cooling air source), providing the flexibility of a full mechanical fan-driven system but without the associated costs (both of construction and operation), complexity and redundancy drawbacks and risks.

Preferably, the method of cooling items of electronic equipment comprises transporting the cooling air from the cooling air source to the one or more cold aisles entirely under the control of the fans of the rack-mountable items of electronic equipment. When the transport of cooling air is controlled entirely by the fans of the electronic equipment the efficiency of the method is further improved because it allows for further reduction in duplication and redundancy, that might otherwise be required/present in the method.

Optionally, the air supply corridor of the data centre building has a cross-sectional area of at least 3 $m^2$, preferably at least 5 $m^2$, for example at least 9 $m^2$, along 90% of its length. It has been found that when the air supply corridor has a cross-sectional area of 3 $m^2$ or more along 90% of its length the resistance to air flow around the data centre building is reduced, thereby reducing the air velocity required to transport a given volume of cooling air from the cooling air source to the cold aisles, thus also reducing the demand placed on the fans of the items of electronic equipment. Preferably, the air supply corridor has a cross-sectional area of at least 3 $m^2$, such as 5 $m^2$, for example 9 $m^2$, for its entire length from the cooling air source to the one or more cold aisles.

Preferably, the cooling air source is arranged such that cooling air exiting the cooling air source flows directly into a personnel area in the data centre. Optionally, the cooling air source is in the form of an air treatment unit, wherein the air treatment unit is arranged in the data centre so that cooling air exiting the air treatment unit flows directly into a personnel area of the data centre, for example without passing through any ductwork. Preferably, the data centre comprises a cooling air flow path leading from an air treatment unit cooling air source to one or more cold aisles, wherein that cooling air flow path is substantially, optionally entirely, free from ducting. Preferably, the data centre comprises a cooling air flow path leading from an air treatment unit cooling air source to one or more cold aisles that is accessible to personnel along at least 90% of its length. It will be appreciated that an air flow path that is accessible to personnel is sized and configured such that personnel can enter and pass along the air flow path (the path, for example being designed for an average adult to be able to walk in). As used herein, a 'personnel area' is an area of the data centre designed to be readily accessed by personnel and occupied by at least one adult in a standing position, for example being in the form of a corridor, a room, or the like. It will be appreciated that data centre personnel areas may only infrequently be occupied or accessed by personnel. The inside of an air-duct having a cross-section of less than 0.5 $m^2$ would not be considered as being a personnel area.

Preferably, at least part of the air supply corridor is located on the same level of the data centre as one or more cold aisles. Optionally, at least part of the air supply corridor is located on the same floor of the data centre as the one or more cold aisles.

Preferably, the air supply corridor provides personnel access to at least one cold aisle. Additionally or alternatively, the air supply corridor may provide personnel access to at least part of the cooling air source.

Preferably, the air supply corridor has a height of at least 1.5 m, such as at least 2 m, above the floor for at least 90% of its length.

Preferably, the cooling air source comprises an adiabatic humidifier, and the method comprises controlling the adiabatic humidifier to adjust the humidity and/or temperature of the cooling air. Preferably, the method comprises operating the adiabatic humidifier to adjust the temperature and/or humidity of the cooling air according to pre-determined temperature and/or humidity ranges. It has been found that an adiabatic cooler can provide a particularly efficient means of controlling the temperature and humidity of the cooling air. It will be appreciated that in order to efficiently and safely cool the rack-mounted items of electronic equipment, the temperature and humidity if the cooling air should fall within desired temperature and humidity ranges.

It may be that the cooling air source provides cooling air through the use of an air conditioning arrangement that may, according to need, include evaporative cooling, DX cooling, filtration of ambient air, and/or control louvres to regulate air flow. It may be that the cooling air source is in fluid communication with the ambient air outside the data centre building. Additionally or alternatively, it may be that the cooling air source is indirectly in contact with a cooling fluid (such as the ambient air outside of the data centre building), for example by means of a heat exchanger.

Preferably, the cooling air source is a direct air handling unit that supplies cooling air comprising ambient air from outside the data centre. Preferably, the direct air handling unit comprises one or more adiabatic cooling units, such as a wetted matrix humidifier for cooling the ambient air. Preferably, the direct air handling unit comprises one or more filters for filtering the ambient air. Preferably, the one or more filters are low-resistance filters. Preferably, the direct air handling unit comprises one or more mechanical cooling units, such as a DX cooling unit.

Preferably, the cooling air source is an indirect air handling unit having an external air flow path segregated from an internal air flow path. Optionally, the indirect air handling unit comprises one or more heat exchangers, for example comprising one or more heat tubes, for exchanging heat between air flowing along the internal air flow path and the external air flow path. Preferably, the indirect air handling unit comprises one or more adiabatic cooling units, such as a wetted matrix humidifier, in the external air flow path. Preferably, the indirect air handling unit comprises one or more mechanical cooling units, such as a DX cooling unit, in the internal air flow path. Preferably, the cold aisles of the data centre are in fluid communication with the internal air flow path of the indirect air handling unit. Preferably, the internal air flow path of the indirect air handling unit is substantially free, for example entirely free, from fans for pushing cooling air to the electronic equipment. Preferably, air is transported along the internal air flow path of the indirect air handling unit substantially, for example entirely, under the control of the fans of the rack-mounted items of electronic equipment. Preferably, the indirect air handling unit comprises a plurality of external air fans for transporting ambient air from outside the data centre along the external air flow path. Preferably, when the cooling air source is an indirect air handling unit, substantially all of the cooling air transported by the fans of the rack-mounted items of electronic equipment is 'internal air', that is, air that is recirculated around the data centre. For example, when the cooling air source is an indirect air handling unit, air may flow around the data centre in a closed loop, such as a closed loop extending from the indirect air handling unit to the electronic equipment and back to the indirect air handling unit. It will be appreciated that such a data centre may nevertheless comprise one or more systems for refreshing the internal air by admitting air from outside the data centre into the closed loop system. For example, the data centre may comprise an auxiliary air vent for admitting fresh air into the data centre. In operation, the auxiliary air vent may be operable to admit, for example, a volume of air equivalent to the internal air volume in the data centre more often than once a day, but less often than once a minute (for example at a rate of the order of once every hour). It may be that such a system for refreshing the air is provided to avoid the build-up of stale air inside the data centre.

Preferably, the cooling air source comprises an adjustable inlet vent for admitting outside air into the data centre building, and the method comprises controlling the adjustable inlet vent to vary the amount of outside air admitted into the data centre building. It may be that when the method controls the amount of ambient air admitted into the building through the adjustable inlet vent the method efficiently balances the cooling air requirements of the electronic equipment to reduce (and preferably substantially minimise) the amount of mechanical cooling and/or humidification/dehumidification required.

Preferably, air to be cooled is transported to the cooling air source substantially under the control of the fans of the rack-mountable items of electronic equipment. For example, when the cooling air source is supplied with air to be cooled from outside the data centre building, air from outside the data centre building is drawn into the cooling air source substantially, such as substantially entirely, under the control of the fans of the rack-mountable items of electronic equipment. Additionally or alternatively, when the cooling air source is supplied with air to be cooled from inside the data centre (for example, warm air returning to the cooling air source from one or more rack mounted items of electronic equipment), the air from inside the data centre building is transported to the cooling air source substantially under the control of the fans of the rack-mountable items of electronic equipment.

Preferably, the method comprises passing air through the cooling air source substantially under the control of the fans of the rack-mountable items of electronic equipment. Preferably, the cooling air source comprises an adiabatic humidifier and the method comprises transporting air to be cooled to the adiabatic humidifier and transporting cooling air from the adiabatic humidifier substantially under the control of the fans of the rack-mountable items of electronic equipment. Preferably the adiabatic humidifier comprises a wetted matrix humidifier.

Preferably, the data centre building comprises an air extraction corridor for receiving air from the one or more hot aisles, and the method comprises transporting air from the one or more hot aisles to the air extraction corridor at least partially under the control of the fans of the rack-mountable items of electronic equipment. It may be that when the data centre comprises an air extraction corridor for receiving air from the one or more hot aisles the data centre building provides a particularly low resistance, high volume air flow path for air that has been used to cool the items of electronic equipment to be conveyed along away from the items of electronic equipment. Preferably, the air extraction corridor of the data centre building has a cross-sectional area of at least 3 m$^2$, preferably 5 m$^2$, for example 9 m$^2$, along 90% of its length. It has been found that when the air extraction corridor has a cross-sectional area of 3 m$^2$ or more along 90% of its length the resistance to air flow around the data centre building is reduced, thereby reducing the air velocity required to transport a given volume of air that has been used to cool the items of electronic equipment away from the from racks, thus also reducing the demand placed on the fans of the items of electronic equipment.

Optionally, the data centre comprises an adjustable exhaust vent for allowing air to pass from inside the data centre to outside the data centre building. Preferably, the method comprises controlling the adjustable exhaust vent to vary the amount of air allowed to pass from inside the data centre to outside the data centre. Optionally, when the data centre building comprises an air extraction corridor, the air extraction corridor comprises an adjustable exhaust vent for allowing air to be pass from inside the data centre to outside the data centre building, and the method comprises controlling the adjustable exhaust vent to vary the amount of air allowed to pass from inside the data centre to outside the data centre. It may be that when the method controls the amount of hot air allowed to pass from inside the building to outside the building through the adjustable exhaust vent the method efficiently balances the cooling air requirements of the electronic equipment to minimise the amount of mechanical cooling and/or humidification/dehumidification required. It may be that the more hot air that is allowed to exit the data centre building, the more ambient air that is drawn into the data centre building. Thus, when the ambient air temperature is low, it may be desirable to allow more hot air to exit the building through the exhaust vent.

The one or more fans in the electronic equipment may be the primary means by which air is drawn into the cooling air source. For example, the one or more fans in the electronic equipment may be the primary means by which air is drawn in from outside the data centre, in the case where ambient air is used for cooling. It may be that the one or more fans in the electronic equipment are the primary means by which air is drawn through the adiabatic cooler/evaporative humidifier when such equipment forms part of the cooling air source. In certain embodiments it may be possible for the one or more fans in the electronic equipment to be the primary means by which air, exhausted from the items of electronic equipment, is moved further downstream, for example so as to be (at least partially) exhausted out of the data centre (for example, to the atmosphere) and/or (at least partially) recirculated within the data centre. In other embodiments there may be a need for further means of encouraging air flows downstream of the items of electronic equipment. There may for example be one or more exhaust fans, for example one or more variable speed fans, for assisting the expelling of air out of the data centre building.

The above-mentioned exhaust vent may comprise a variable speed fan for expelling air out of the data centre building. There may be a step of controlling the speed of such a variable speed fan to adjust the amount of air expelled from the data centre building. It may be that the use of an adjustable exhaust vent comprising a variable speed fan helps to prevent a build-up of hot air in the air extraction corridor, for example when the data centre is operating in a mode in which the cooling air comprises mostly or entirely ambient air from outside the data centre building. Alternatively or additionally, it may be that the variable speed fan is used to assist in expelling hot air out of the data centre building when outside conditions hinder such expulsion, for example if the force of the wind outside opposes expulsion of hot air out of the data centre building. It will be appreciated that wind and/or other weather phenomena could lead to a build-up of air pressure on the outside of the adjustable exhaust vent, preventing adequate expulsion of hot air. It will be appreciated that, in the context of the present invention, the use of such exhaust fans (fans downstream of the items of electronic equipment that are operated to assist with the expelling of air for example) does not assist, at least not in any significant way, with the drawing of cold air across the items of electronic equipment—such a step being performed substantially by means of the fans of the rack-mountable items of electronic equipment. It may be that the method comprises operating the fans of the rack-mountable items of electronic equipment and the exhaust fans such that the sum air circulation (in m$^3$/s) caused by the rack-mountable items of electronic equipment is larger than the sum air circulation (in m$^3$/s) caused by the exhaust fans. For example, the method comprises using the fans of the rack-mounted items of electronic equipment to transport a larger volume of air per second than the volume of air transported by the exhaust fans. This may be measured by operating the fans of the rack-mounted items of electronic equipment but not the exhaust fans leaving all other conditions the same and comparing the rate of air flow to when the exhaust fans, not the fans of the rack-mounted items of electronic equipment, are operating, leaving all other conditions the same. It may be that the method comprises operating the data centre in a first mode in which the exhaust fans are not used to assist in exhausting air out of the data centre, and a second mode in which the exhaust fans are used to assist in exhausting air out of the data centre. Preferably, the data centre is operated in the first mode for at least 25% of a given time (such as a month or a year), such as at least 50%, for example at least 75% or at least 90%. Preferably, the method comprises using the exhaust fans to maintain a pre-determined pressure differential between the cold area of the data centre and the hot area of the data centre. For example, it may be that the exhaust fans are only operated when the pressure differential between the cold and hot areas of the data centre exceeds a certain pre-set value. Preferably, the data centre is configured such that the fans of the items of electronic equipment are capable of maintaining the pressure differential below the pre-set value without the assistance of the exhaust fans for at least 25%, for example at least 50%, such as at least 75% or at least 90%, of the time that the data centre operates.

Preferably, when the data centre building comprises an air extraction corridor, the air extraction corridor comprises an adjustable recirculation vent for allowing air to recirculate from the air extraction corridor to the cooling air source. The method may comprise a step of controlling the adjustable recirculation vent to vary the amount of air allowed to recirculate from the air extraction corridor to the cooling air source. It may be that when the method comprises controlling the amount of hot air recirculated from the air extraction corridor back to the cooling air source, the method efficiently balances the cooling air requirements of the electronic equipment to minimise the amount of mechanical cooling and/or humidification/dehumidification required.

Preferably, the air extraction corridor has a cross-sectional area of at least 3 m$^2$, for example 5 m$^2$, for its entire length from the one or more hot aisles to the adjustable exhaust vent and/or to the adjustable recirculation vent.

Optionally, at least one of the one or more cold aisles comprises an adjustable vent for admitting cooling air into the cold aisle from the air supply corridor. Preferably, the method comprises controlling the adjustable vent to vary the amount of air supplied from the air supply corridor to the one or more cold aisles.

Optionally, the one or more cold aisles comprises an adjustable vented door providing access to the air supply corridor, and the method comprises controlling the adjustable vented door to vary the amount of air supplied from the air supply corridor to the one or more cold aisles. It may be that when the method comprises controlling the amount of air supplied from the air supply corridor to the one or more cold aisles the method efficiently regulates the supply of cooling air to the one or more cold aisles without unduly burdening the fans of the items of electronic equipment. For example, it may be that in a data centre comprising two cold aisles, when the items of electronic equipment in the first cold aisle are working at a higher load than the items of electronic equipment in the second cold aisle, more cooling air might be required in the first cold aisle. Opening the vents of the adjustable vented door of the first cold aisle wider than those of the adjustable vented door of the second cold aisle may lower the air flow resistance into the first cold aisle thereby allowing the fans of the items of electronic equipment in the first cold aisle to draw in more cooling air without having to compete with the fans of items of electronic equipment in the second cold aisle. The use of adjustable vented doors (such as louvered doors, for example automatic louvered doors, under the control of the data centre building control system) allows further control and management of the cooling air supply to restrict/isolate the air flow path away from areas where cooling air demand is lower, and to direct cooling air to exactly where it is required.

It will be appreciated that the method of the first aspect of the invention can be performed using a data centre having any one of a very large number of layout designs, providing of course that a low resistance, high volume air flow path is provided from the cooling air source to the racks of items of electronic equipment thereby allowing low velocity, high volume distribution of cooling air. For example, using the air supply corridor and cold aisles as the principal air flow path allows the velocity of the cooling air to be kept low, avoiding the cooling air unintentionally bypassing items of electronic equipment located close to the point at which the cooling air enters the cold aisle.

The method of the first aspect of the invention helps avoid the historical server overheating problems associated with using air to cool servers and significantly raises the erroneously perceived threshold of the limits of air based server cooling. It will be appreciated that electronic equipment fan power typically constantly alters according to demand, maintaining the minimum flow of cooling air over the item of electronic equipment. It is preferred that each fan in the rack-mounted items of electronic equipment is controlled by the corresponding item of electronic equipment to operate in one of two, possibly three and optionally more levels of demand ("no demand" being included as such a level) in dependence on the cooling needs of the item of electronic equipment (preferably as determined by the item of electronic equipment). Each fan may be thermostatically controlled, for example. The low resistance, high volume air flow path from the cooling air source to the racks of items of electronic equipment allows the fans on the items of electronic equipment to draw sufficient cooling air to maintain adequate cooling of all items.

It may be that one or more of the items of electronic equipment are servers, for example server blades. It may be that one or more of the items of electronic equipment comprises a plurality of fans. It may be that one or more of the items of electronic equipment are network equipment. It may be that one or more of the items of electronic equipment are in the form of operational IT equipment being items of equipment that process, retrieve and/or store computer data, such as client data—i.e. the core IT equipment that provides the function of the data centre.

The method may be so performed that the air flow rate at any position along the (upstream) air flow path is less than 110% of the sum of the air flow rates effected by the fans of all those items of electronic equipment supplied with air from that position. It may be that there are some positions along the (upstream) air flow path at which the air flow rate is less than the sum of the air flow rates effected by the fans of all those items of electronic equipment supplied with air from that position (as a result for example in losses through air resistance and the like). The method may be so performed that the air flow rate at any position along the (upstream) air flow path is more than 50% of the sum of the air flow rates effected by the fans of all those items of electronic equipment supplied with air from that position. Attaining such a relatively high flow rate at all positions on the flow path upstream of the racks may be achievable my means of providing a high cross-sectional area and low resistance air flow path.

According to a second aspect of the invention, the invention provides a data centre building for use in the method of the first aspect of the invention. The data centre building of the second aspect of the invention may thus comprise a cooling air source. The data centre building may comprise at least one rack room having a floor and a plurality of rack storage areas on the floor, each rack storage area being arranged to accommodate a plurality of racks in which a plurality of rack-mountable electronic components having at least one fan may be housed. The data centre building may comprise one or more such racks installed in the building. Such racks may include one or more electronic components mounted therein. There may be one or more cold aisles, for example in a given rack room. There may be only one discernible rack room in the data centre, or there may be more than one. There may be one or more hot aisles. The data centre building may comprise an air supply corridor for transporting cooling air, above the floor, from the cooling air source to the one or more cold aisles. In embodiments of the invention, the data centre building is arranged such that, in use, transport of the cooling air from the cooling air source to the racks in which the items of electronic equipment are mounted (which may require transporting of the cooling air from the cooling air source to one or more cold aisles) is controlled and/or effected substantially entirely by the fans of the rack-mounted electronic components. When the data centre is arranged in this manner, the data centre may be operated particularly efficiently.

Preferably, the data centre is arranged such that the transport of the cooling air is controlled and/or effected entirely by the fans of the rack-mountable electronic components. Such an arrangement may allow for a particularly efficient operation of the data centre.

Optionally, the air supply corridor has a cross-sectional area of at least 3 $m^2$, for example 5 $m^2$, such as 9 $m^2$, for at least 90% of its length. Such an air supply corridor provides a particularly low resistance to air flow.

Preferably, the data centre building comprises an adjustable intake vent for admitting ambient air from outside the data centre building into the data centre building.

Optionally, the data centre building comprises a heat exchanger for exchanging the heat from warm air inside the data centre with cooler air outside of the data centre.

Preferably, the cooling air source comprises an adiabatic humidifier.

Optionally, the data centre comprises one or more hot corridors for receiving air from the one or more hot aisles. Optionally, the one or more hot corridors comprises an adjustable exhaust vent for exhausting hot air out of the data centre building. Preferably, the adjustable exhaust vent comprises a fan for expelling air out of the data centre building. Optionally, the one or more hot corridors comprises an adjustable recirculation vent for allowing hot air to recirculate to the cooling air source.

Preferably, the data centre comprises an internal air flow path defined by the cooling air source, the one or more cold corridors, the one or more cold aisles, the rack storage areas holding a plurality of electronic components in the form of servers having at least one integral fan, the one or more hot aisles and the one or more hot corridors, wherein the internal air flow path is free from air circulation devices such as fans, other than the integral fans of the servers. It will be appreciated that an integral fan of a server is a fan that is provided to meet the cooling requirements of that individual server. Preferably, the internal air flow path is an isolated air flow path, meaning that the air flow path is arranged such that during normal operation, little or no air circulating along the path exits the data centre building and little or no air from outside the data centre building is admitted into the air flow path. In such an isolated air flow path arrangement, it may be that the data centre comprises an indirect air handling unit as the cooling air source, such as an air handling unit comprising a heat exchanger, for transferring heat from the air circulating along the isolated air flow path to ambient air outside of the data centre. Preferably, when the internal air flow path is an isolated air flow path, the internal air flow path is free from air purifying devices such as filters or filter banks, thus reducing the resistance to air flow along the internal air flow path. Preferably, the internal air flow path extends from a first location in the data centre upstream of the cooling air source to a second location in the data centre downstream of the electronic components.

It will of course be appreciated that features described in relation to one aspect of the present invention may be incorporated into the other aspect of the present invention. For example, the apparatus of the invention may incorporate any of the features described with reference to the method of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
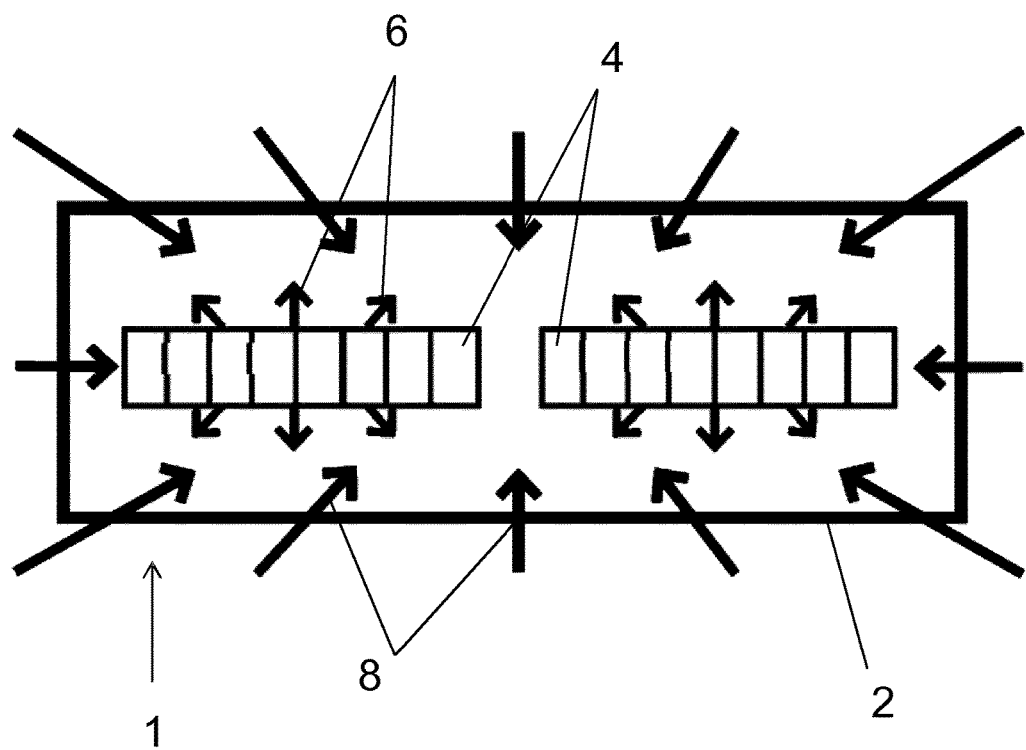
FIG. 1 shows a prior art rack room.
Figure 2:
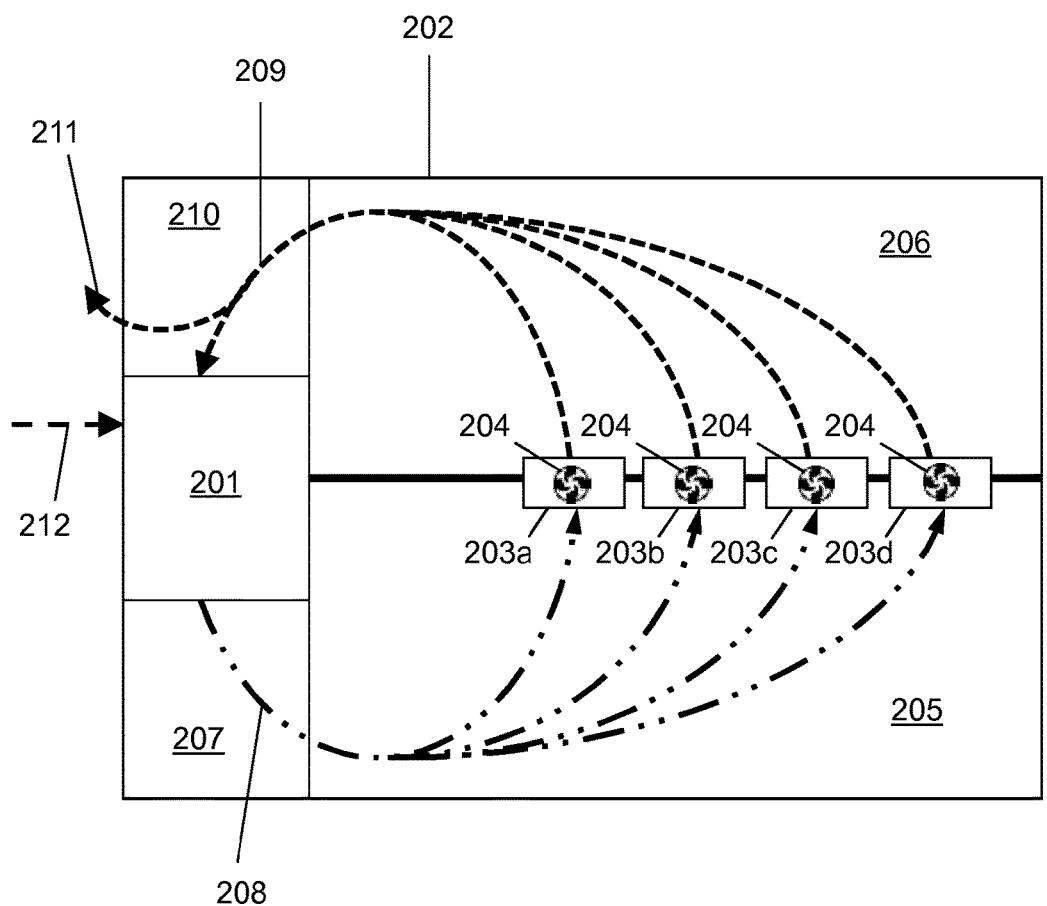
FIG. 2 shows a schematic diagram of the method of the first aspect of the invention.

FIG. 2 shows a schematic of a method of cooling a data centre according to a first embodiment of the invention. The data centre comprises a cooling air source 201, a rack room 202 having a floor and a plurality of rack storage areas 203a-203d on the floor, each rack storage area accommodating a plurality of racks in which a plurality of rack-mountable items of electronic equipment having at least one fan 204 are housed; a cold aisle 205 in the rack room 202; a hot aisle 206 in the rack room 202; and an air supply corridor 207 for transporting cooling air 208, above the floor, from the cooling air source 201 to the cold aisle 205. The method of the first embodiment of the invention comprises transporting cooling air from the cooling air source 201 to the cold aisle 205 substantially under the control of the fans 204 of the rack-mountable items of electronic equipment. The method also comprises returning heated air 209 from the hot aisle 206 to the cooling air source 201 via an air extraction corridor 210, optionally expelling hot air 211 from the data centre building and optionally drawing in ambient air 212 into the cooling air source 201.

Key principles of the method of the first embodiment of the invention are:

1. The air conditioning arrangement (cooling air source 201) has no fans. It may contain, according to specific or climatic requirements, a filtration bank, evaporative or mechanical cooling, bypasses and means of control and may be in fluid communication with the external environment or indirectly in contact with it through the use of a heat exchange system.

2. The air conditioning arrangement is in fluid communication with a cold rack space in which the front face of the server racks is located.

3. The rear of the server racks is located in a separated hot space or spaces, the racks forming part of the separation between the hot and cold spaces. Any server 'u' spaces or rack spaces that are not used are blanked to ensure that air can only entrain from the hot to cold spaces via the servers.

4. All air movement through the system is generated by the individual server fans.

5. Activation of the various air conditioning components and entrainment components is managed by a control system based on information input from sensors used in the control configuration.

6. Optional automatic louvre doors can be used in strategic positions to balance individual cold spaces with high and low air demands if the design requires. The door would be open more for space with high aggregate demand and 'throttle back' for a low demand space.

7. An additional small extract fan may be used in the hot space to dissipate pressure build up in some conditions.

Figure 3:
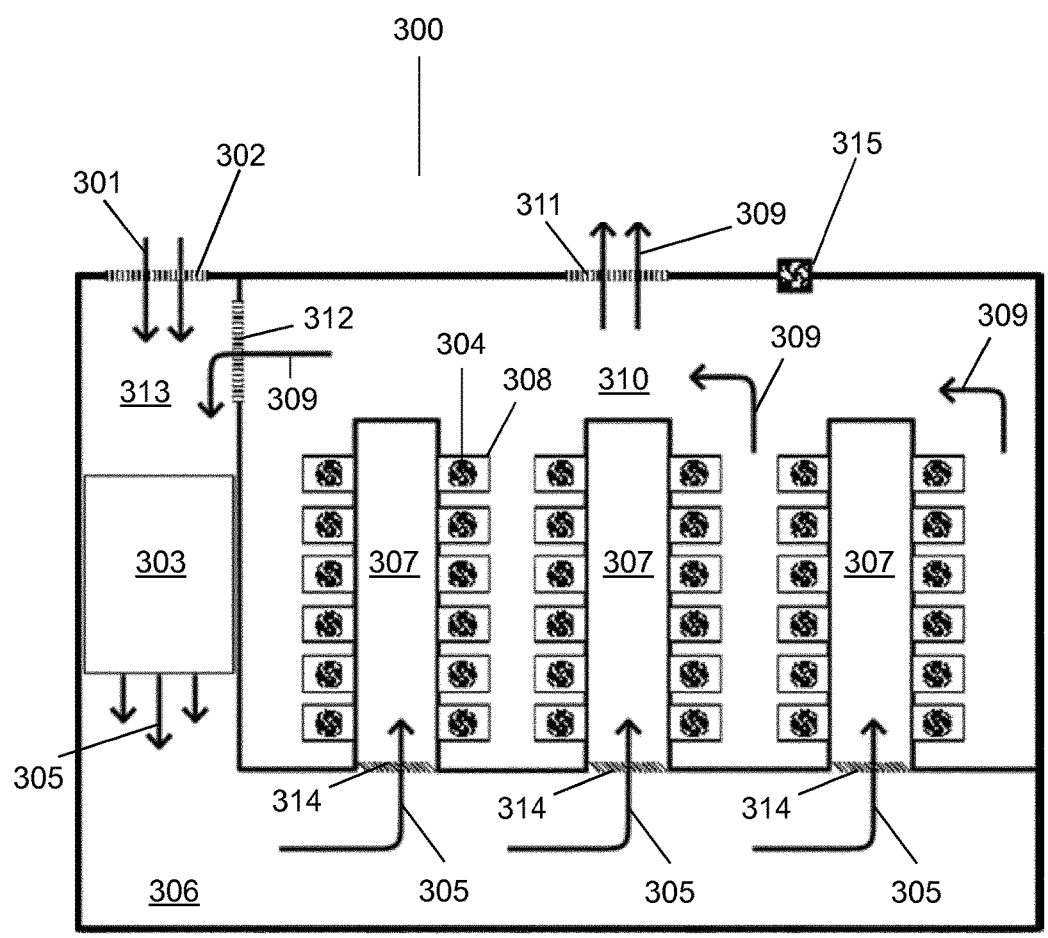
FIG. 3 shows a plan view of a data centre for use in a method according to an embodiment of the invention.

FIG. 3 shows a plan view of a data centre 301 for use in a method according to an embodiment of the invention. The data centre 301 comprises an enclosed hot/cold space configuration. The plan shows that when the data centre 300 is used in the method of a second embodiment of the invention, ambient air 301 is drawn in from the outside the data centre 300 through adjustable intake louvres 302 the air conditioning arrangement 303 (where it is conditioned to the control set points) by the server fans 304. Conditioned air 305 enters cold space 306 and then cold rack spaces 307 where the conditioned air 305 is drawn through each server 308 individually by the integral server fans 304. Hot air 309 is exhausted by each individual server 308 into a hot space 310. Hot air 309 is allowed to exit the building 300 through adjustable exhaust louvres 311 (to the extent that the hot air 309 is not required for recirculation), and/or allowed to pass through adjustable return louvres 312 into a mixing space 313 (to the extent that hot air is required for recirculation to the air conditioning arrangement 303). The cold space 306 is separated from the cold rack spaces 307 by means of doors 314 having adjustable vents for controlling the flow of conditioned air 305 into the cold rack space 307. In the method of this embodiment of the invention, the adjustable vents of the doors 314 may be used to limit the amount of conditioned air 305 that can be drawn into a particular cold rack space 307 thus favouring flow of conditioned air 305 to one or more other cold rack spaces 307 that have a greater demand for conditioned air 305. In this way, the method of this embodiment of the invention may vary the air flow resistance of different air flow paths through the data centre to improve efficiency of the method. The Air flow through the hot space 310 is controlled by the aggregate power of the server fans. The data centre 300 also comprises exhaust fan 315 for aiding the exhaust of hot air 309 out of the hot space 310. Depending on, for example, the weather conditions outside of the data centre, the exhaust fan 315 may be operated to avoid a build-up in air pressure in the hot space 310, which may otherwise inhibit air circulation by the server fans 304.

The hot air 309 may be mixed with ambient air 301 from outside the data centre building 300 in the mixing space 313 when the method of this embodiment of the invention is operating in partial recirculation mode (adjustable intake louvres 302, adjustable exhaust louvres 311 and adjustable return louvres 312 all being at least partially open). When the method of this embodiment of the invention is operating in full exhaust mode (also referred to as full ambient air cooling mode), substantially all or all of the hot air 309 is exhausted through the adjustable exhaust louvres 311, and the air conditioning arrangement 303 is supplied substantially entirely or entirely with ambient air 301 from outside the data centre building 300 (adjustable intake louvres 302 and adjustable exhaust louvres 311 being open and adjustable return louvres 312 being open). When the method of this embodiment of the invention is operating in full recirculation mode, substantially all or all of the hot air 309 is returned to the air conditioning arrangement 303, and substantially no or no ambient air 301 from outside the data centre building is supplied to the air conditioning arrangement 303 (adjustable intake louvres 302 and adjustable exhaust louvres 311 being closed and adjustable return louvres 312 being open). It will be appreciated that in operating a data centre according to the method of this embodiment of the invention, the method may comprise varying the mode of operation from full recirculation to partial recirculation to full ambient cooling depending on the condition of the ambient air and on the load experienced by the items of electronic equipment.

Figure 4:
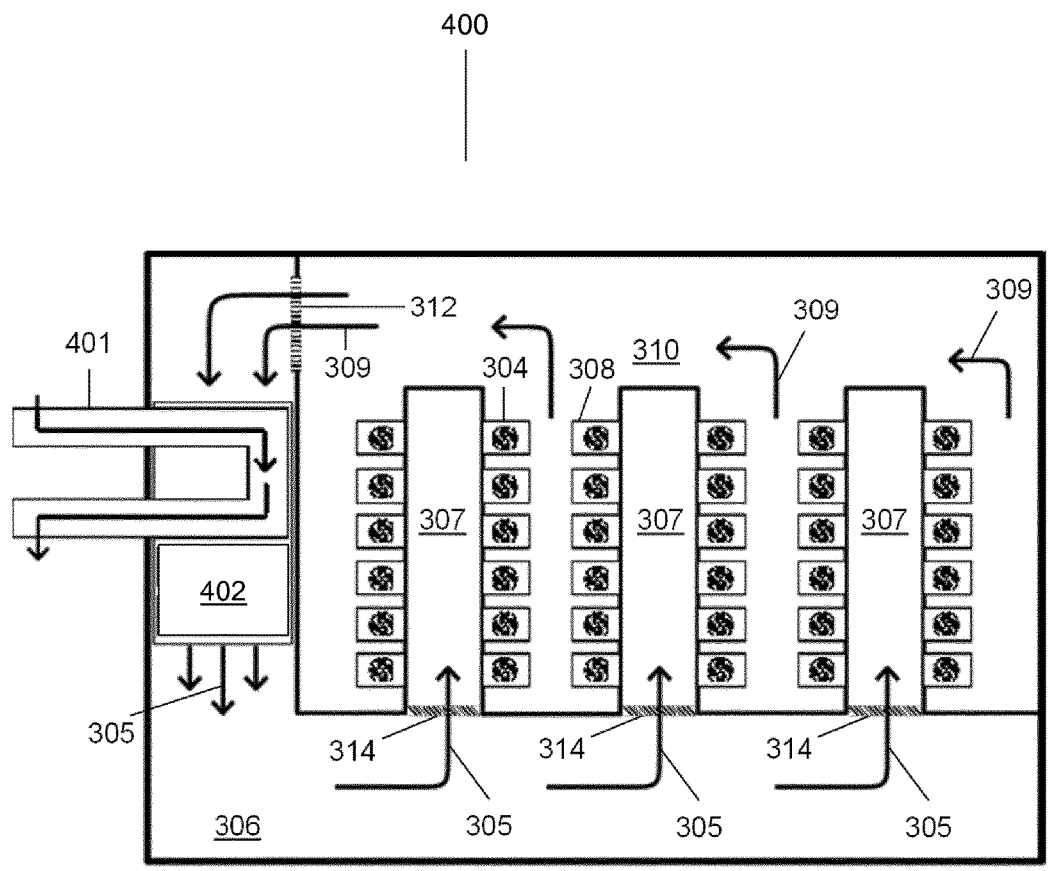
FIG. 4 shows a plan view of a data centre for use in a method according to another embodiment of the invention.

FIG. 4 shows a plan view of a data centre 400 for use in a method according to a third embodiment of the invention, in which the cooling air source utilises a heat exchanger 401. The depiction of the heat exchange unit is purely figurative. A direct expansion (DX) cooling unit 402 is provided downstream of the heat exchanger 401. Those parts of FIG. 4 having the same meaning as in FIG. 3 are labelled with the same reference numerals. The data centre 400 for use in the method of the third embodiment of the invention is a closed system, and so does not include exhaust or intake louvres.

Figure 5:
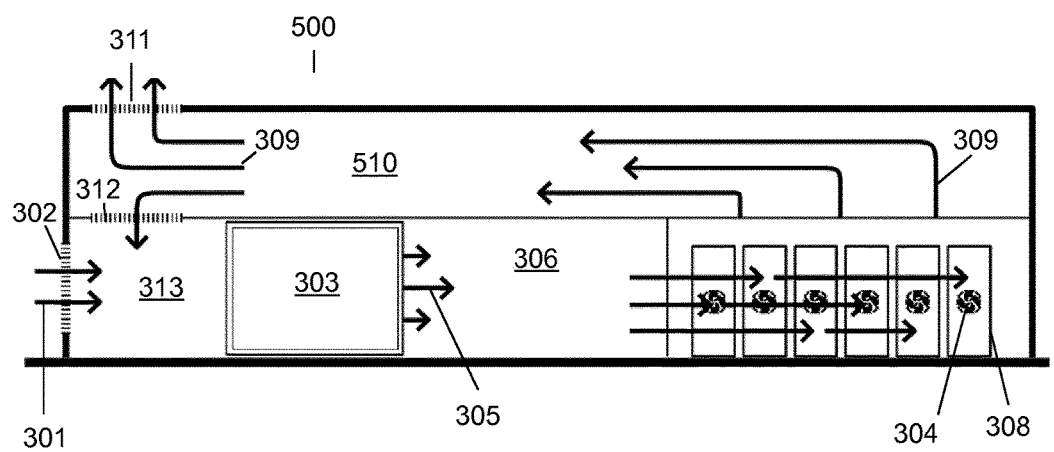
FIG. 5 shows a cross-sectional view of a data centre for use in a method according to another embodiment of the invention.

FIG. 5 shows a cross-sectional view of a data centre 500 for use in a method according to a fourth embodiment of the invention. In the data centre shown, the hot space 510 is in the form of an overhead plenum. Those parts of FIG. 5 having the same meaning as in FIG. 3 are labelled with the same reference numerals.

Figure 6:
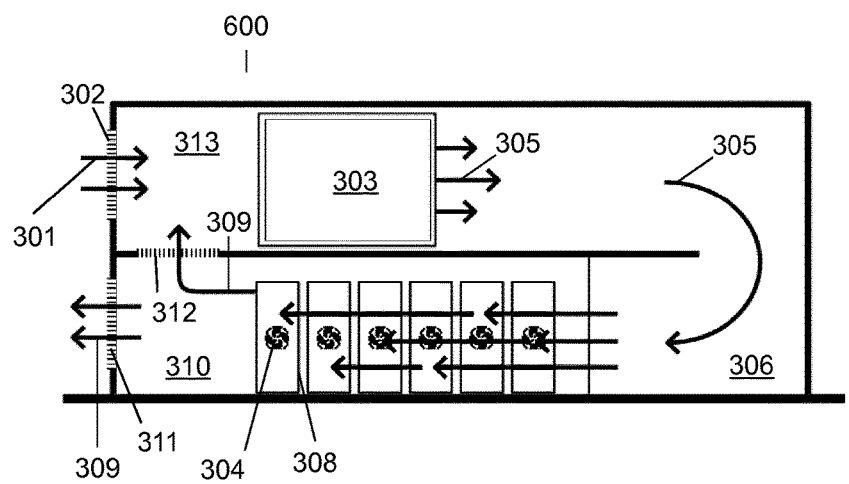
FIG. 6 shows a cross-sectional view of a data centre for use in a method according to another embodiment of the invention.

FIG. 6 shows a cross-sectional view of a data centre 600 for use in a method according to a fifth embodiment of the invention. In the data centre shown, the air conditioning arrangement 303 is positioned above the cold space 306. Those parts of FIG. 6 having the same meaning as in FIG. 3 are labelled with the same reference numerals.

Figure 7:
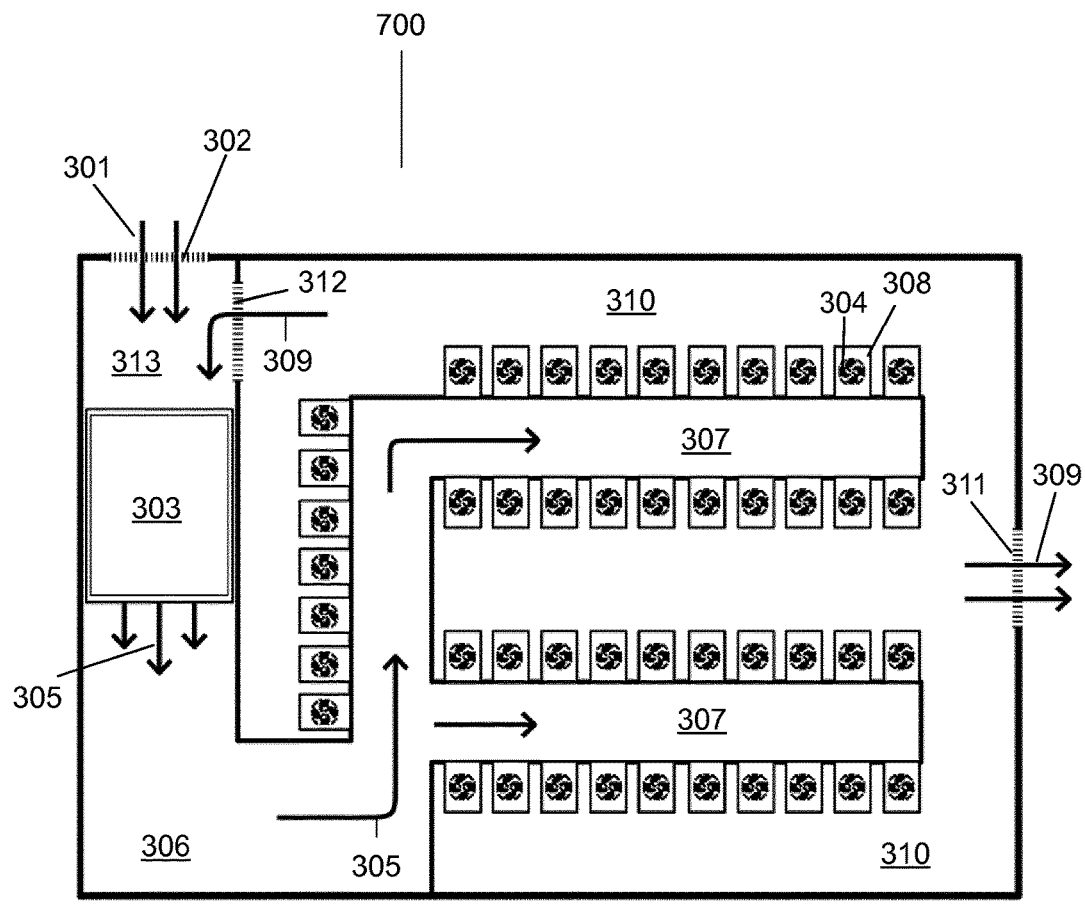
FIG. 7 shows a plan view of a data centre for use in a method according to another embodiment of the invention.

FIG. 7 shows a plan view of a data centre 700 for use in a method according to a sixth embodiment of the invention. The figure shows how, in a sixth embodiment of the invention, the method can be used in a data centre created from an existing internal space, in this case in an existing office building. Those parts of FIG. 7 having the same meaning as in FIG. 3 are labelled with the same reference numerals.

Figure 8:
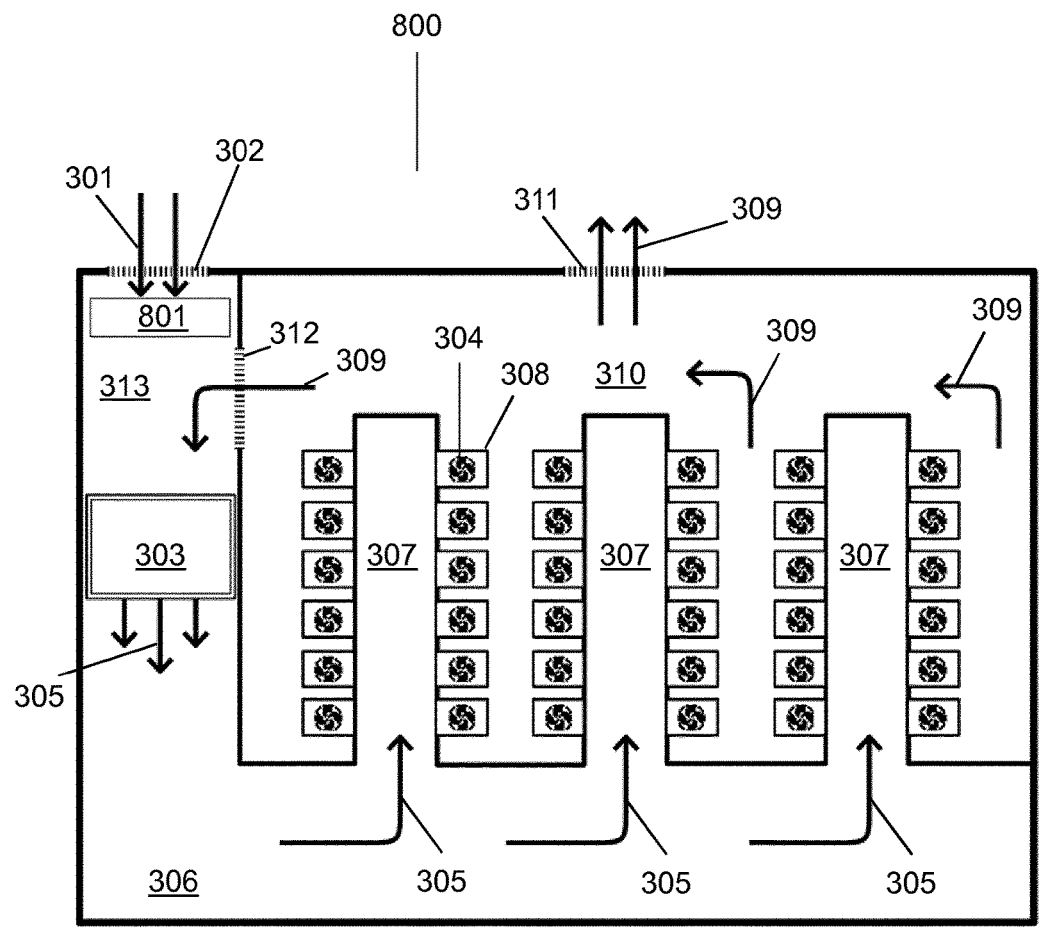
FIG. 8 shows a plan view of a data centre for use in a method according to another embodiment of the invention.

FIG. 8 shows a plan view of a data centre 800 for use in a method according to a seventh embodiment of the invention. The data centre is provided with a filter bank 801 upstream of the air conditioning unit, allowing the return louvres 312 between the hot space 310 and the mixing space 313 to be positioned between the filter 801 and the air conditioning arrangement 303, thereby decreasing resistance from the filters when the method of the embodiment utilises air recirculation. Those parts of FIG. 8 having the same meaning as in FIG. 3 are labelled with the same reference numerals.

Figure 9:
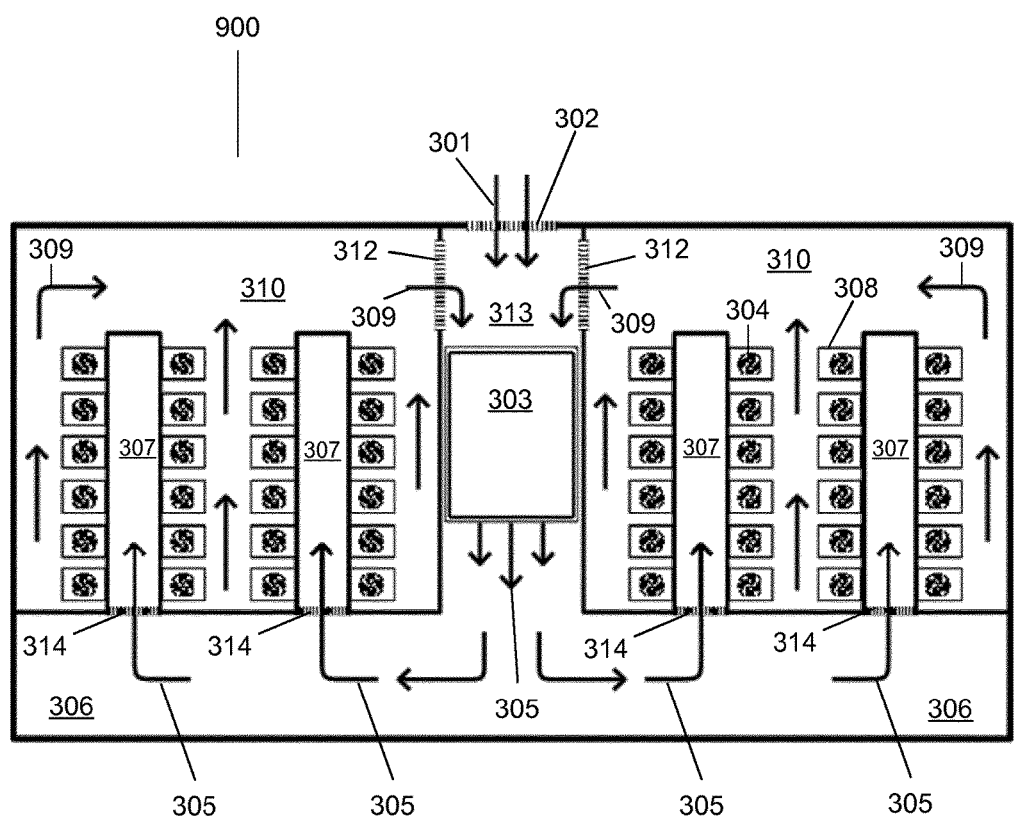
FIG. 9 shows a plan view of a data centre for use in a method according to another embodiment of the invention.

FIG. 9 shows a plan view of a data centre 900 for use in a method according to an eighth embodiment of the invention. In the data centre shown, the air conditioning arrangement 303 is positioned in the middle of the data centre. Those parts of FIG. 9 having the same meaning as in FIG. 3 are labelled with the same reference numerals.

Figure 10:
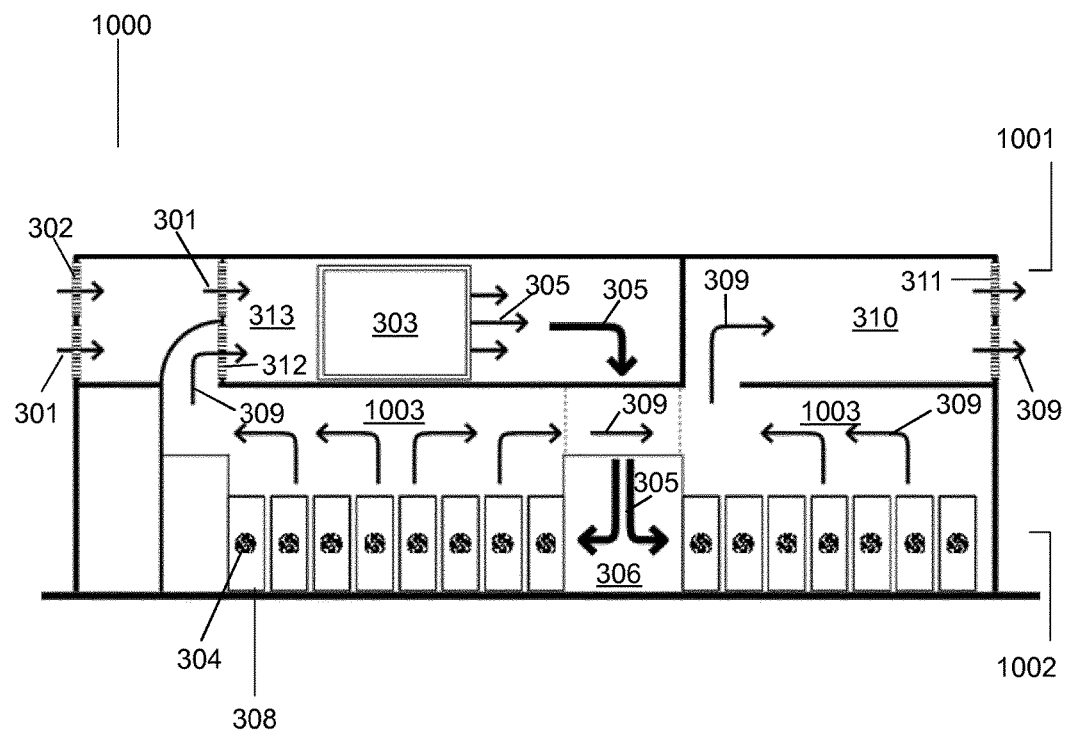
FIG. 10 shows a cross-sectional view of a data centre for use in a method according to another embodiment of the invention.

FIG. 10 shows a cross-sectional view of a data centre 1000 for use in a method according to a ninth embodiment of the invention. In the data centre shown, the air conditioning arrangement 303 is sited on an upper storey 1001, and the rack space is sited on the lower storey 1002 under a hot space plenum 1003 which acts as a route for hot air 309 to be either recirculated or exhausted. Cut outs are provided to allow conditioned air 305 to pass through the hot plenum 1003 level to the cold space 306. Those parts of FIG. 10 having the same meaning as in FIG. 3 are labelled with the same reference numerals.

Figure 11:
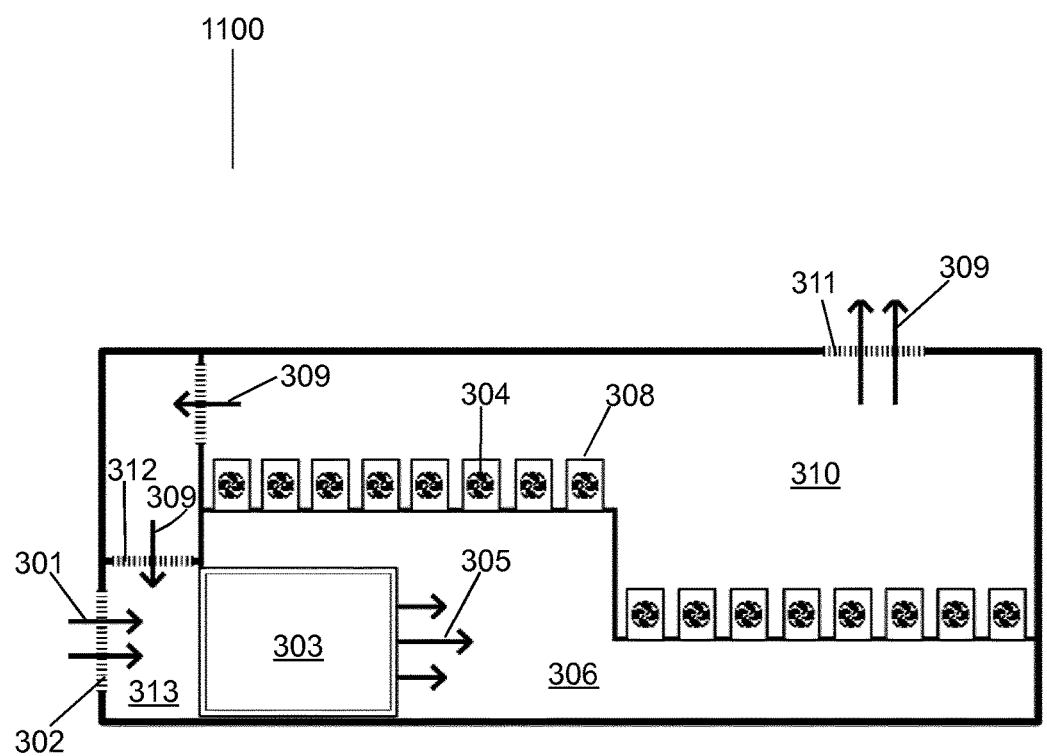
FIG. 11 shows a plan view of a data centre for use in a method according to another embodiment of the invention.

FIG. 11 shows a plan view of a data centre 1100 for use in a method according to a tenth embodiment of the invention. Those parts of FIG. 11 having the same meaning as in FIG. 3 are labelled with the same reference numerals.

Figure 12:
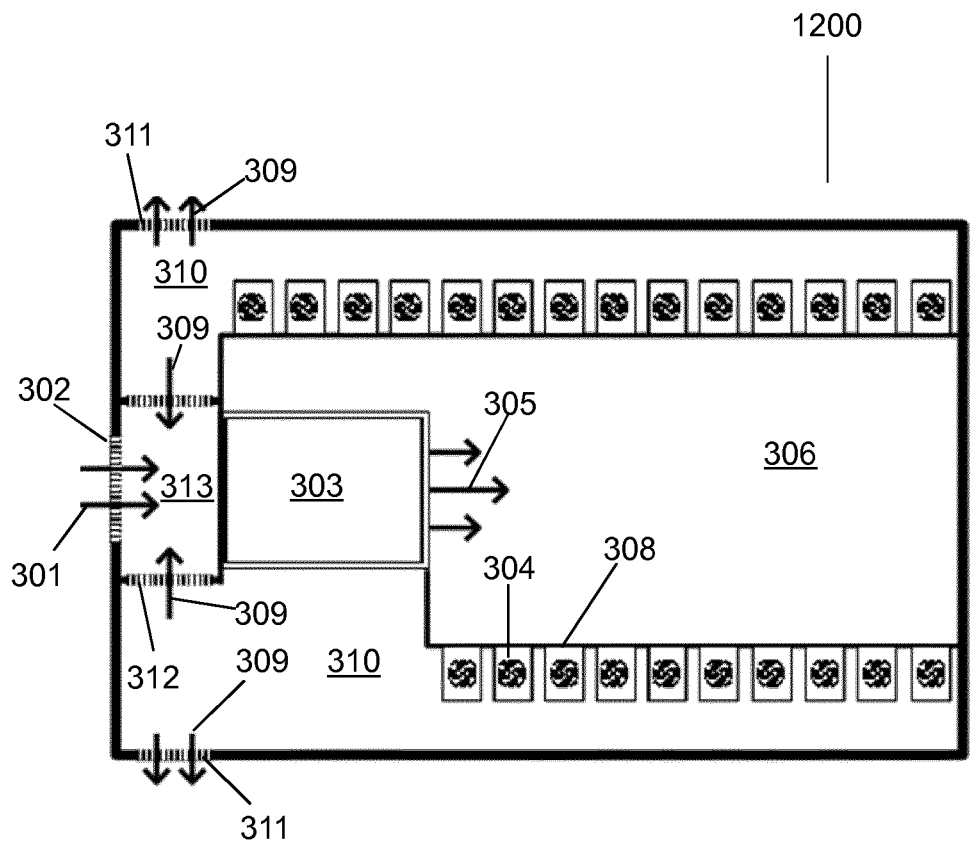
FIG. 12 shows a plan view of a data centre for use in a method according to another embodiment of the invention.

FIG. 12 shows a plan view of a data centre 1200 for use in a method according to an eleventh embodiment of the invention. Those parts of FIG. 12 having the same meaning as in FIG. 3 are labelled with the same reference numerals.

Figure 13:
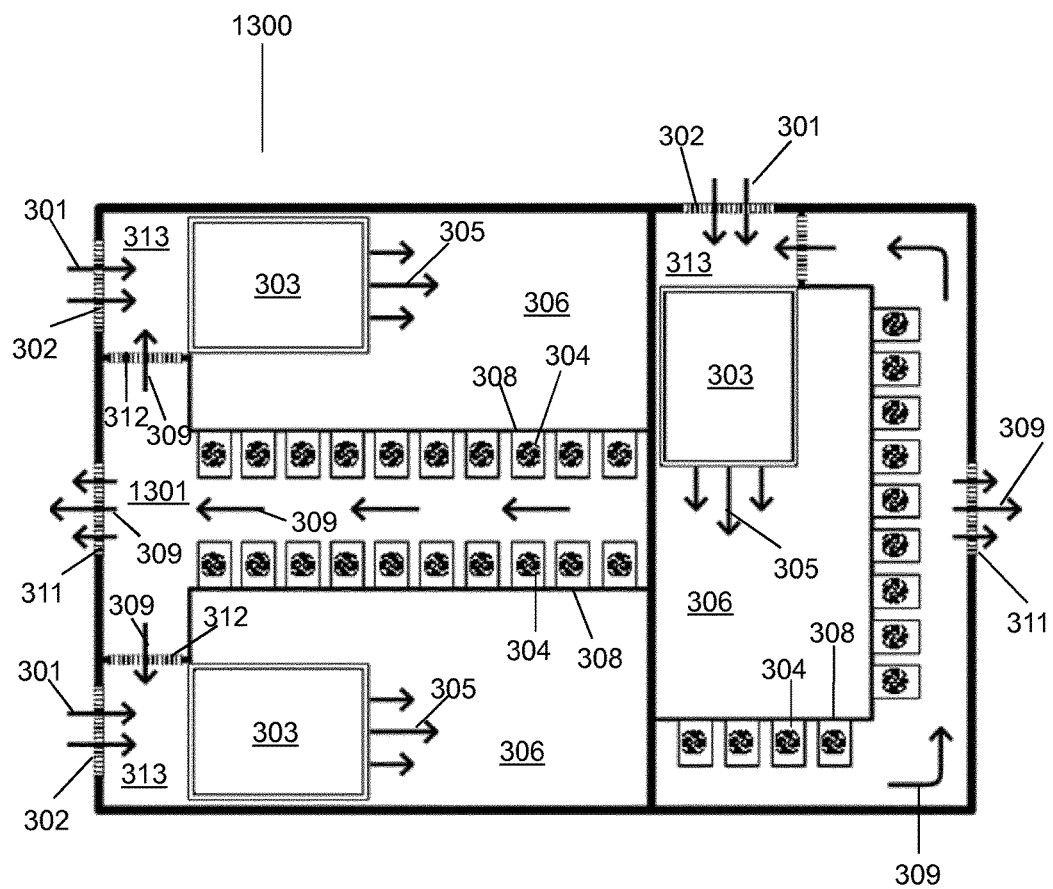
FIG. 13 shows a plan view of a data centre for use in a method according to another embodiment of the invention.

FIG. 13 shows a plan view of a data centre 1300 for use in a method according to a twelfth embodiment of the invention. In the data centre shown, the data centre is divided into three data hall spaces, two of which share a hot space 1301 for exhaust and recirculation. Those parts of FIG. 13 having the same meaning as in FIG. 3 are labelled with the same reference numerals.

Figure 14:
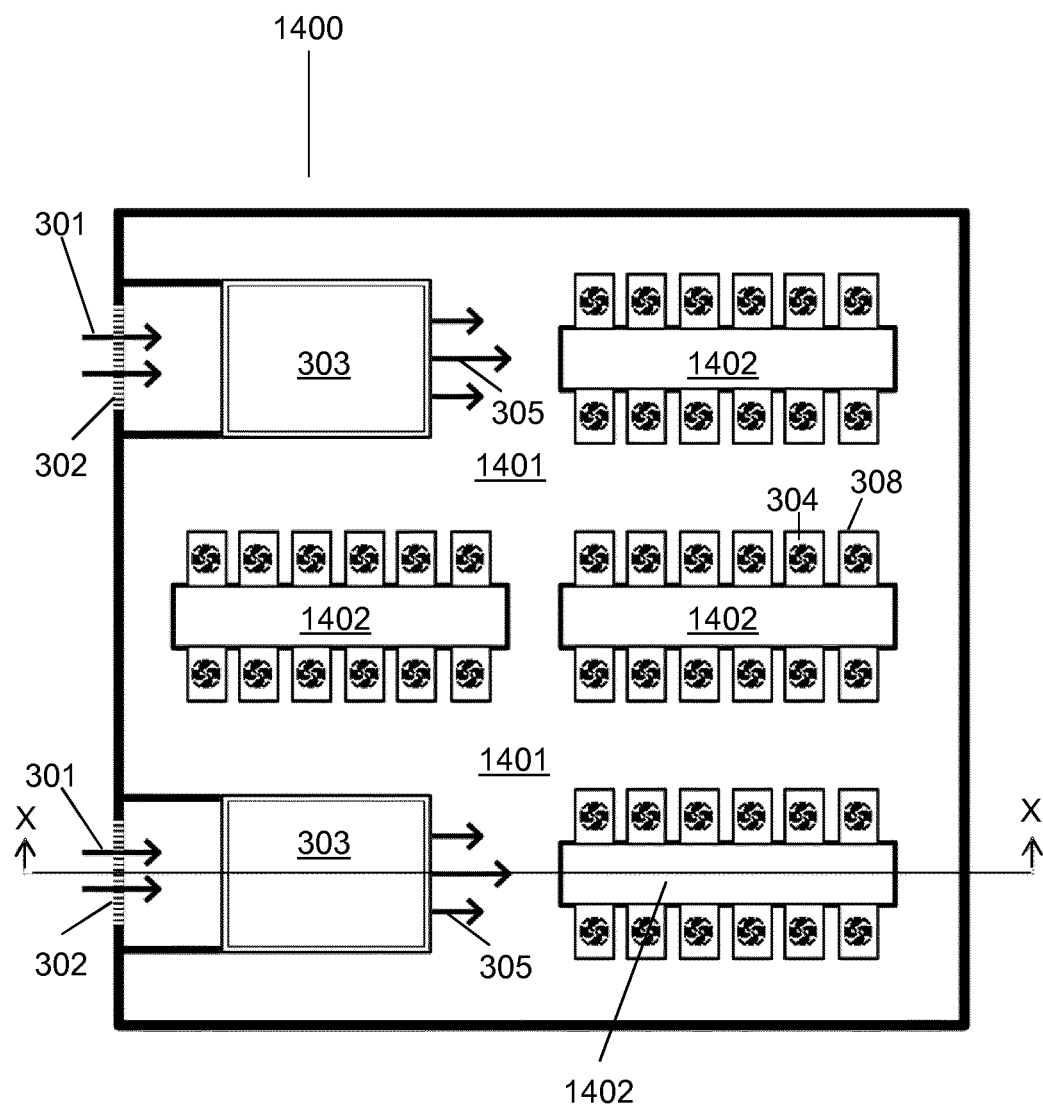
FIG. 14 shows a plan view of a data centre for use in a method according to another embodiment of the invention.

FIG. 14 shows a plan view of a data centre 1400 for use in a method according to a thirteenth embodiment of the invention. In the data centre shown, multiple air conditioning arrangements 303 are disposed to feed one common cold space 1401, and groups of racks share a hot space 'chimney' 1402 which connects to a shared overhead hot plenum 1403 for recirculation (with optional mechanical assistance 1404 to direct the warm air back down to the mixing space 313) or exhaust. Those parts of FIG. 14 having the same meaning as in FIG. 3 are labelled with the same reference numerals.

Figure 15:
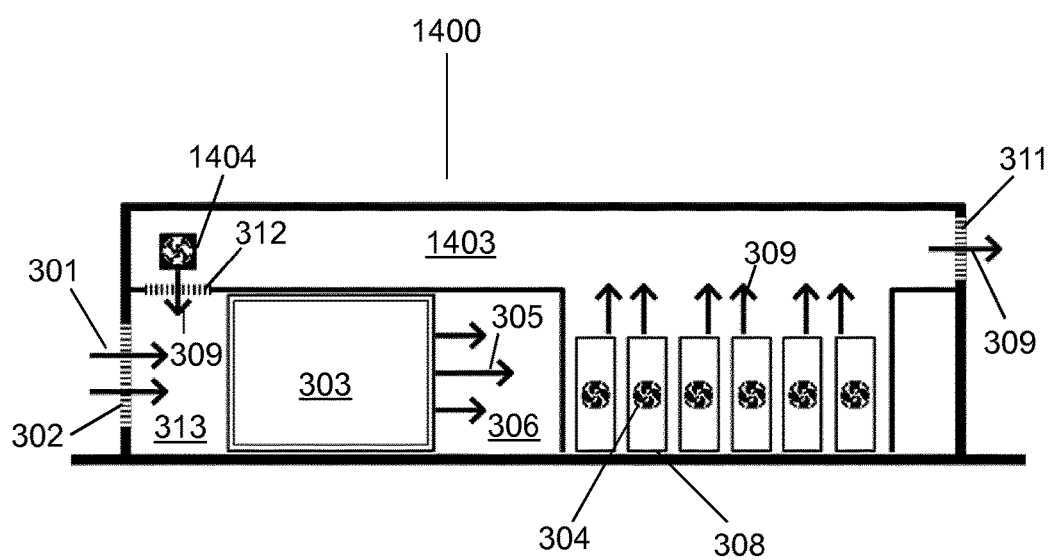
FIG. 15 shows a cross-sectional view of a data centre for use in a method according to another embodiment of the invention.

FIG. 15 shows a cross-sectional view of the data centre 1400 of FIG. 14 taken along the line X-X indicated by the black dotted arrows in FIG. 14. Those parts of FIG. 15 having the same meaning as in FIG. 3 are labelled with the same reference numerals.

Whilst the present invention has been described and illustrated with reference to particular embodiments, it will be appreciated by those of ordinary skill in the art that the invention lends itself to many different variations not specifically illustrated herein.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of cooling a data centre, wherein the data centre comprises: a cooling air source; at least one rack room having a floor and a plurality of rack storage areas on the floor, each rack storage area accommodating a plurality of racks in which a plurality of rack-mountable items of electronic equipment having at least one fan are housed; one or more cold aisles in the rack room, each cold aisle being adjacent to a rack storage area; one or more hot aisles in the rack room, each hot aisle being adjacent to a rack storage area; and an air supply corridor for transporting cooling air, above the floor, from the cooling air source to the one or more cold aisles, the air supply corridor having a cross-sectional area of at least 3 $m^2$ along 90% of its length; and wherein the data centre is cooled by operating the fans for the rack-mountable items of electronic equipment to transport cooling air from the cooling air source to the one or more cold aisles and back to the cooling air source, wherein the fans of the rack mountable electronic equipment are necessary and sufficient to directly cause circulation of the cooling air between the cooling air source and the one or more cold aisles without the aid of gravity.

2. The method of claim 1, wherein the method comprises transporting the cooling air from the cooling air source to the one or more cold aisles entirely under the control of the fans of the rack-mountable items of electronic equipment.

3. The method of claim 1, wherein the method comprises transporting air to be cooled to the cooling air source substantially under the control of the fans of the rack-mountable items of electronic equipment.

4. The method of claim 3, wherein the air to be cooled comprises air from inside the data centre and/or air from outside the data centre.

5. The method of claim 1, wherein the air supply corridor of the data centre building has a cross-sectional area of at least 5 $m^2$ along 90% of its length.

6. The method of claim 1, wherein the cooling air source comprises an adiabatic humidifier, and wherein the method comprises controlling the adiabatic cooler to adjust the humidity and/or temperature of the cooling air.

7. The method of claim 1, wherein the cooling air source comprises an adjustable inlet vent for admitting outside air into the data centre building, and wherein the method comprises controlling the adjustable inlet vent to vary the amount of outside air admitted into the data centre building.

8. The method of claim 1, wherein the data centre building comprises an air extraction corridor for receiving air from the one or more hot aisles, and wherein the method comprises transporting air from the one or more hot aisles to the air extraction corridor at least partially under the control of the fans of the rack-mountable items of electronic equipment.

9. The method of claim 8, wherein the air extraction corridor comprises an adjustable exhaust vent for allowing air to pass from inside the data centre to outside the data centre building, and wherein the method comprises controlling the adjustable exhaust vent to vary the amount of air allowed to pass from inside the data centre to outside the data centre.

10. The method of claim 9, wherein the adjustable exhaust vent comprises a variable speed fan for expelling air out of the data centre building, and wherein the method comprises controlling the speed of the variable speed fan to adjust the amount of air expelled from the data centre building.

11. The method of claim 8, wherein the air extraction corridor comprises an adjustable recirculation vent for allowing air to recirculate from the air extraction corridor to the cooling air source, and wherein the method comprises controlling the adjustable recirculation vent to vary the amount of air allowed to recirculate from the air extraction corridor to the cooling air source.

12. The method of claim 8, wherein the one or more cold aisles comprises an adjustable vented door providing access to the air supply corridor, and wherein the method comprises controlling the adjustable vented door to vary the amount of air supplied from the air supply corridor to the one or more cold aisles.

13. The method of claim 1, wherein the cooling air source is an indirect air handling unit having an external air flow path segregated from an internal airflow path, the internal air flow path being in fluid communication with the one or more cold aisles, the indirect air handling unit comprising one or more heat exchangers for exchanging heat between air flowing along the internal air flow path and air flowing along the external air flow path, wherein air is transported along the internal air flow path substantially under the control of the fans of the rack-mountable items of electronic equipment.

14. The method of claim 13, wherein air flows around the data centre in a closed loop extending from the indirect air handling unit to the electronic equipment and back to the indirect air handling unit.

15. The method of claim 1, wherein the air supply corridor is accessible to personnel along at least 90% of its length.

16. The method of claim 1, wherein the air supply corridor provides personnel access to at least one cold aisle.

17. A data centre building wherein the building comprises: a cooling air source; at least one rack room having a floor and a plurality of rack storage areas on the floor, each rack storage area accommodating a plurality of racks in which a plurality of rack-mountable items of electronic equipment having at least one fan are housed; one or more cold aisles in the rack room, each cold aisle being adjacent to a rack storage area; one or more hot aisles in the rack room, each hot aisle being adjacent to a rack storage area; and an air supply corridor for transporting cooling air, above the floor, from the cooling air source to the one or more cold aisles, the air supply corridor having a cross-sectional area of at least 3 m$^2$ along 90% of its length; wherein the data centre building is structured so that cooling air from the cooling air source is transported to the one or more cold aisles by operation of the fans of the rack-mountable items of electronic equipment, wherein the fans of the rack-mountable electronic equipment are necessary and sufficient to directly cause circulation of the cooling air between the cooling air source and the one or more cold aisles without the aid of gravity.

18. The data centre building of claim 17 wherein the data centre building is structured so that cooling air from the cooling air source is transported to the one or more cold aisles entirely under the control of the fans of the rack-mountable items of electronic equipment.

19. The data centre building of claim 17, wherein the air supply corridor of the data centre building has a cross-sectional area of at least 5 m$^2$ along 90% of its length.

20. The data centre building of claim 17, comprising an adjustable intake vent for admitting ambient air from outside the data centre building into the data centre building.

21. The data centre building of claim 17, comprising a heat exchanger for exchanging the heat from warm air inside the data centre with cooler air outside of the data centre.

22. The data centre building of claim 17, comprising an internal air flow path defined by the cooling air source, the one or more cold corridors, the one or more cold aisles, the rack storage areas holding a plurality of electronic components in the form of servers having at least one integral fan, the one or more hot aisles and the one or more hot corridors, wherein the internal air flow path is free from air circulation devices such as fans, other than the integral fans of the servers.

23. The data centre building of claim 17 comprising an air extraction corridor for receiving airflow from the one or more hot aisles, said airflow being at least partially under the control of the fans of the rack-mountable items of electronic equipment; said data centre building optionally containing at least one of the following features, selected from the group consisting of:

a) an adjustable exhaust vent contained in said air extraction corridor to vary the amount of air allowed to pass from inside the data centre to outside the data centre;
b) an adjustable exhaust vent contained in said air extraction corridor, comprising a variable speed fan for expelling air out of the data centre building, and wherein the method comprises controlling the speed of said variable speed fan to adjust the amount of air expelled from the data centre building;
c) an adjustable recirculation vent contained in said air extraction corridor for allowing air to recirculate air from the air extraction corridor to the cooling air source and varying the amount of air allowed to recirculate from the air extraction corridor to the cooling air source;
d) an adjustable recirculation vent contained in said air extraction corridor for allowing air to recirculate from the air extraction corridor to the cooling air source and for varying the amount of air allowed to recirculate from the air extraction corridor to the cooling air source
e) an adiabatic humidifier component of the cooling air source to adjust the humidity and/or temperature of the cooling air.

24. The data centre building of claim 17 wherein the one or more cold aisles comprise an adjustable vented door providing access to the air supply corridor, which may be adjusted to vary the amount of air supplied from the air supply corridor to the one or more cold aisles.

25. The data centre building of claim 17, wherein the cooling air source is an indirect air handling unit having an external air flow path segregated from an internal airflow path, the internal air flow path being in fluid communication with the one or more cold aisles, the indirect air handling unit comprising one or more heat exchangers for exchanging heat between air flowing along the internal air flow path and air flowing along the external air flow path, and wherein the data centre is structured so that air is transported along the internal air flow path substantially under the control of the fans of the rack-mountable items of electronic equipment.

26. The data centre building of claim 25, wherein the data centre is structured so that air flows around the data centre in a closed loop extending from the indirect air handling unit to the electronic equipment and back to the indirect air handling unit.

27. The data centre building of claim 17, wherein the cooling air flow path leading from the cooling air source to the rack-mountable items of electronic equipment has a sum volume that is selected from the range consisting of from 75% to 125% and from 90% to 110% of the volume of the warm air flow path leading from the rack-mountable items of electronic equipment back to the cooling air source.

28. The data centre building of claim 17, wherein the air supply corridor is accessible to personnel along at least 90% of its length.

29. The data centre building of claim 17, wherein the air supply corridor provides personnel access to at least one cold aisle.

30. A method of cooling servers in a data centre, wherein the servers are mounted in server racks arranged in at least one row along at least one cold aisle, the at least one cold aisle being segregated from at least one hot aisle by the at least one row of server racks, the servers each including at least one fan for drawing cooling air from the at least one cold aisle, wherein the data centre comprises a cooling air source, the cooling air source being an indirect air handling unit having an external air flow path segregated from an internal airflow path, the internal air flow path being in fluid communication with the at least one cold aisle, the indirect air handling unit comprising one or more heat exchangers for exchanging heat between air flowing along the internal air flow path and air flowing along the external air flow path, wherein the servers are cooled by operating the fans of the servers to transport cooling air from the cooling air source to the at least one cold aisle and hence to the servers and back to the cooling air source, wherein the fans of the rack-mountable electronic equipment are necessary and sufficient to directly cause circulation of the cooling air between the cooling air source and the one or more cold aisles without the aid of gravity.

31. The method of claim 30, wherein the method comprises transporting air along the internal air flow path of the indirect air handling unit substantially under the control of the fans of the servers.

32. The method of claim 31, wherein the data centre is structured so that air flows around the data centre in a closed loop extending from the indirect air handling unit to the servers and back to the indirect air handling unit.

33. The method of claim 31, wherein the internal air flow path is free from filters.

34. A data centre, wherein the data centre accommodates a plurality of servers mounted in server racks arranged in at least one row along at least one cold aisle, the at least one cold aisle being segregated from at least one hot aisle by the at least one row of server racks, the servers each including at least one fan for drawing cooling air from the at least one cold aisle, wherein the data centre comprises a cooling air source, the cooling air source being an indirect air handling unit having an external air flow path segregated from an internal airflow path, the internal air flow path being in fluid communication with the at least one cold aisle, the indirect air handling unit comprising one or more heat exchangers for exchanging heat between air flowing along the internal air flow path and air flowing along the external air flow path, and wherein the data centre is structured so that cooling air is transported from the cooling air source to the at least one cold aisle and hence to the servers and back to the cooling air source by operation of the fans of the servers, wherein the fans of the servers are necessary and sufficient to directly cause circulation of the cooling air between the cooling air source and the one or more cold aisles without the aid of gravity.

35. The data centre of claim 34, wherein the data centre and the indirect air handling unit are structure so that air is transported along the internal air flow path of the indirect air handling unit substantially under the control of the fans of the servers.

36. The method of claim 31, wherein the data centre is structured so that air flows around the data centre in a closed loop extending from the indirect air handling unit to the servers and back to the indirect air handling unit.

37. The method of claim 31, wherein the internal air flow path is free from filters.

\* \* \* \* \*

UNITED STATES PATENT AND TRADEMARK OFFICE
CERTIFICATE OF CORRECTION

PATENT NO. : 10,485,141 B2
APPLICATION NO. : 15/574782
DATED : November 19, 2019
INVENTOR(S) : Rogers et al.

Page 1 of 1

It is certified that error appears in the above-identified patent and that said Letters Patent is hereby corrected as shown below:

In the Claims

Column 18, Line 24: Claim 6 replace "cooler" with "humidifier".

Column 22, Line 18: Claim 35 replace "structure" with "structured".

Column 22, Line 22: Claim 36 replace "method of claim 31" with "data centre of claim 34".

Column 22, Line 26: Claim 37 replace "method of claim 31" with "data centre of claim 34".

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*